(12) United States Patent
Rivas-Davila et al.

(10) Patent No.: US 12,573,987 B2
(45) Date of Patent: Mar. 10, 2026

(54) APPARATUSES AND METHODS INVOLVING FREQUENCY-SELECTIVE POWER AMPLIFICATION

(71) Applicant: The Board of Trustees of the Leland Stanford Junior University, Stanford, CA (US)

(72) Inventors: Juan Rivas-Davila, Palo Alto, CA (US); Jiale Xu, Stanford, CA (US); Kawin Surakitbovorn, Menlo Park, CA (US); Benjamin Wang, Stanford, CA (US); Mark A. Cappelli, Stanford, CA (US)

(73) Assignee: The Board of Trustees of the Leland Stanford Junior University, Stanford, CA (US)

( * ) Notice: Subject to any disclaimer, the term of this patent is extended or adjusted under 35 U.S.C. 154(b) by 397 days.

(21) Appl. No.: 18/111,767

(22) Filed: Feb. 20, 2023

(65) Prior Publication Data

US 2023/0283249 A1 Sep. 7, 2023

Related U.S. Application Data

(60) Provisional application No. 63/316,878, filed on Mar. 4, 2022.

(51) Int. Cl.
| | |
|---|---|
| *H03F 3/217* | (2006.01) |
| *H05H 1/24* | (2006.01) |
| *H03F 1/56* | (2006.01) |

(52) U.S. Cl.
CPC ......... H03F 3/2176 (2013.01); H05H 1/2406 (2013.01); *H03F 1/56* (2013.01);
(Continued)

(58) Field of Classification Search
CPC ........ H03F 3/211; H03F 1/0288; H03F 1/565; H03F 2200/387; H03F 2200/451
(Continued)

(56) References Cited

U.S. PATENT DOCUMENTS

| | | | | |
|---|---|---|---|---|
| 5,969,582 A | * | 10/1999 | Boesch | .................. H04B 1/005 |
| | | | | 333/132 |
| 8,628,640 B2 | * | 1/2014 | Hayami | ............ H01J 37/32174 |
| | | | | 156/345.44 |

(Continued)

FOREIGN PATENT DOCUMENTS

| | | | | | |
|---|---|---|---|---|---|
| KR | 102785087 B1 | * | 3/2025 | ........ | H01J 37/32935 |
| SG | 11202101095 S | * | 3/2021 | ........... | H03H 19/004 |

OTHER PUBLICATIONS

Hideharu Shintani, "Sterilization Mechanism of Nitrogen Gas Plasma Exposure" | by SciDoc Publishers | Medium (Year: 2015).*

(Continued)

*Primary Examiner* — Hafizur Rahman
(74) *Attorney, Agent, or Firm* — Crawford Maunu PLLC

(57) ABSTRACT

In certain examples, methods and semiconductor structures are directed to a switching (power) amplification circuit, including resonance circuitry to resonate at a frequency associated with at least one of a plurality of different selectable resonance frequencies. The switching amplification circuit is configured to deliver power to one or multiple loads while the switching amplifier circuit is operating based on one or more of the selectable resonance frequencies.

19 Claims, 9 Drawing Sheets

(52) U.S. Cl.
    CPC .. *H03F 2200/387* (2013.01); *H03F 2200/451* (2013.01); *H05H 2242/24* (2021.05); *H05H 2242/26* (2021.05)

(58) Field of Classification Search
    USPC .......................................................... 330/295
    See application file for complete search history.

(56) References Cited

U.S. PATENT DOCUMENTS

| | | | | |
|---|---|---|---|---|
| 8,810,313 | B2 * | 8/2014 | Liu ............................ | H03F 3/19 |
| | | | | 330/126 |
| 10,389,400 | B2 * | 8/2019 | Tombak ..................... | H01Q 1/50 |
| 12,322,572 | B2 * | 6/2025 | Howald ............. | H01J 37/32183 |
| 2014/0346875 | A1 * | 11/2014 | Chinga .................... | H02M 7/44 |
| | | | | 307/31 |
| 2018/0090996 | A1 * | 3/2018 | Kitamura ............... | A61C 17/22 |
| 2019/0206658 | A1 * | 7/2019 | Roy .................. | H01J 37/32348 |

OTHER PUBLICATIONS

Xu, Jiale, et al. "Frequency-Selective MHz Power Amplifier for Dielectric Barrier Discharge Plasma Generation." IEEE Open Journal of Power Electronics 3 (Nov. 2022): 846-855. The Examiner is respectfully referred to Appendix C of the underlying U.S. Appl. No. 63/316,878, from which the inventor publication is derived.

Smith, Collin, Alfred K. Hill, and Laura Torrente-Murciano. "Current and future role of Haber-Bosch ammonia in a carbon-free energy landscape." Energy & Environmental Science 13.2 (2020): 331-344.

Capdevila-Cortada, M. Electrifying the Haber-Bosch. Nat Catal 2, 1055 (2019).

Wu, Hunter H., et al. "A series-tuned inductive-power-transfer pickup with a controllable AC-voltage output." IEEE Transactions on Power Electronics 26.1 (2010): 98-109. Abstract Only.

Kim, Young-Joon, et al. "Selective wireless power transfer for smart power distribution in a miniature-sized multiple-receiver system." IEEE Transactions on Industrial Electronics 63.3 (2015): 1853-1862. Abstract Only.

Zhang, Yiming, et al. "Selective wireless power transfer to multiple loads using receivers of different resonant frequencies." IEEE Transactions on Power Electronics 30.11 (2014): 6001-6005. Abstract Only.

Farmehini, Vahid, et al. "A wide-bandwidth power amplifier for frequency-selective insulator-based dielectrophoresis." Lab on a Chip 14.21 (2014): 4183-4187.

Sze, Christina, et al. "Plasma-fixated nitrogen as fertilizer for turf grass." RSC advances 11.60 (2021): 37886-37895.

Kumar, Narendra, et al. "High-efficiency broadband parallel-circuit class E RF power amplifier with reactance-compensation technique." IEEE Transactions on Microwave Theory and Techniques 56.3 (2008): 604-612.

Han, Yehui, et al. "Resistance compression networks for radio-frequency power conversion." IEEE Transactions on Power Electronics 22.1 (2007): 41-53.

Jurkov, Alexander S., Aaron Radomski, and David J. Perreault. "Tunable matching networks based on phase-switched impedance modulation." IEEE Transactions on Power Electronics 35.10 (2020): 10150-10167.

Roslaniec, Lukasz, et al. "Design of single-switch inverters for variable resistance/load modulation operation." IEEE Transactions on Power Electronics 30.6 (2014): 3200-3214.

RO4000 series high frequency circuit materials, rogers corporation, 2018, 3 pgs (print May 6, 2024). [Online]. Available: https://www.rogerscorp.com/advanced-electronics-solutions/ro4000-series-laminates.

Al Bastami, Anas, et al. "A 1.5 KW radio-frequency tunable matching network based on phase-switched impedance modulation." IEEE Open Journal of Power Electronics 1 (2020): 124-138.

Raab, Frederick H. "Broadband class-E power amplifier for HF and VHF." 2006 IEEE MTT-S International Microwave Symposium Digest. IEEE, 2006. Abstract Only.

Tong, Zikang, Lei Gu, and Juan Rivas-Davila. "Wideband PPT Class $\Phi_2$ Inverter Using Phase-Switched Impedance Modulation and Reactance Compensation." IEEE Transactions on Industrial Electronics 69.6 (2021): 5724-5734. Abstract Only.

Zhou, Jiafeng, et al. "Improved reactance-compensation technique for the design of wideband suboptimum class-E power amplifiers." IEEE Transactions on Microwave Theory and Techniques 63.9 (2015): 2793-2801.

Xu, Jiale, Zikang Tong, and Juan Rivas-Davila. "1 kW MHz wideband class E power amplifier." IEEE Open Journal of Power Electronics 3 (2022): 84-92.

Wang, Hua, Constantine Sideris, and Ali Hajimiri. "A CMOS broadband power amplifier with a transformer-based high-order output matching network." IEEE journal of solid-state circuits 45.12 (2010): 2709-2722.

Beltran, Ramon A. "Broadband outphasing transmitter using class-E power amplifiers." 2019 IEEE MTT-S International Microwave Symposium (IMS). IEEE, 2019. Abstract Only.

Jurkov, Alexander S. Techniques for efficient radio frequency power conversion. Diss. Massachusetts Institute of Technology, 2019.

\* cited by examiner

APPARATUSES AND METHODS INVOLVING FREQUENCY-SELECTIVE POWER AMPLIFICATION

BACKGROUND

Aspects of the present disclosure are related generally to the field of switching-power amplification circuits, and as may be exemplified in connection with use of such amplifiers for driving loads in efficient and/or optimized manners.

One example of a type of load that may be benefited by certain aspects of the present disclosure is a dielectric barrier discharge (DBD) load. A DBD load is a discharge type of load used in connection with nitrogen fixation processes to generate high output of $NO_x$ gas under atmospheric conditions. For example, a certain type of nitrogen fixation processes, referred to as plasma-assisted nitrogen fixation, may be used at atmospheric pressure as a relatively clean process for decentralized fertilizer production. Such benefits of plasma-assisted nitrogen fixation are best appreciated with an understanding of previous fertilizer-production processes, such as the Haber-Bosch process which has been a primary method used in the production of ammonia from nitrogen and hydrogen, with the ammonia used mainly as fertilizer products.

Recent reports have indicated that fertilizer production based on the Haber-Bosch process has been responsible for almost 2% of carbon dioxide global emissions. Although efforts have been made to decarbonize the process for reducing its inherent emission-intensive nature, such efforts have provided limited levels of success. The Haber-Bosch process involves chemical reactions to improve agricultural yields by increasing the ammonia fertilizer production, and this process has been specifically noted for helping in growth of foods worldwide. For example, in 2020, global ammonia production is reported as being about 144 million metric tons, and more than 95% of ammonia is produced through use of the Haber-Bosch process.

The Haber-Bosch process fixes nitrogen with hydrogen to produce ammonia with the feedstock of natural gas (50%), oil (31%) or coal (19%). Burning these fossil fuels during the process leads to more than 1% of world's total $CO_2$ emission. Alternative Haber-Bosch processes, including the ones being electrically-driven using renewable energy, have come into sight to reduce the environmental impact. However, the reaction still happens at high temperatures (400-500° C.) and high pressures (15-25 MPa), thereby requiring a centralized plant. Moreover, transportation of the ammonia produced from such centralized plants has presented environmental and cost problems, and has been cited as being dangerous since the ammonia is highly toxic and flammable when exposed to high temperatures.

Non-thermal atmospheric pressure plasma (NTAPP) has gained attention as a sustainable replacement for conventional nitrogen fixation process. With the development of low-temperature plasma science, the lowest theoretical energy consumption of non-thermal plasma-assisted fixation is lower than that of the Haber-Bosch process. The fixation process applies plasma at the surface of air and water to form soluble reactive oxygen and nitrogen species (RONS). The species include nitrate ($NO^-_3$) and other forms of nitrogen compounds, all of which can used as fertilizers. The plasma-assisted nitrogen fixation works under atmospheric conditions without emission of greenhouse gases. Localized production due to the reduced system size also eliminates potential cost and hazards during transportation.

Literature has discussed different discharge types for nitrogen fixation, including microwave plasma system, spark discharge, gliding arc discharge, and as noted above, DBD. Among these alternatives, both the gliding arc discharge and DBD have high output of $NO_x$ gas and can operate under the atmospheric pressure. In connection with certain specific examples experimentally developed in connection with the present disclosure, aspects have been directed to design of a power amplifier to produce DBD plasma. For previous DBD systems which use power supplies that generate output signals having a low-frequency (e.g., in the range of 50 Hz to a few tens of kHz) for providing a multi-kV output at the plasma load, the research has shown that the discharge activities occur during the zero crossings of the applied voltage which, disadvantageously, correspond to the intervals of the greatest voltage slew rate and maximum current.

Accordingly, improvement may be found in connection with efficiencies, stability, etc. in connection many different types of power-amplification circuitries including but not limited to the above scenarios, for example, wherein the power-amplifier drives a certain type of frequency-reactive load.

SUMMARY OF VARIOUS ASPECTS AND EXAMPLES

Various examples/embodiments presented by the present disclosure are directed to issues such as those addressed above and/or others which may become apparent from the following disclosure. For example, some of these disclosed aspects are directed to methods and devices that use a frequency-selective power amplifier where the frequency range may be, as one example, in the range of megahertz (MHz), and/or where the power amplifier is configured to selectively deliver power to certain loads at different switching frequencies. Other aspects are directed to overcoming previously-used techniques, such as discussed above, by use of switching amplification circuitry having resonance circuitry to resonate at a frequency associated with at least one of a plurality of different selectable resonance frequencies.

According to certain of the above and other example aspects, the present disclosure may be applied to overcome issues concerning previously-existing power amplifiers such as commercial power amplifiers used in the plasma generation industries. For example, according to certain specific embodiments of the present disclosure, one type of switch-mode power amplifier design is more efficient and compact than such commercial power amplifiers as used in the plasma generation industries. When used in the plasma-assisted nitrogen fixation, the overall system for fertilizer production is much smaller and more environmental-friendly than the conventional Haber-Bosch process. The plasma-assisted nitrogen fixation works under atmospheric conditions without emission of green-house gases. Localized production due to the reduced system size also eliminates potential cost and hazards during transportation. Unlike many switch-mode power amplifiers which only work at a fixed frequencies, certain exemplary designs according to the present disclosure allow for efficient power delivery to the selected loads at multiple switching frequencies.

In specific examples, the present disclosure is directed to a method and/or a circuit-based apparatus (e.g., system or integrated-circuit device) that includes a switching (power) amplification circuit which is integrated with resonance circuitry, wherein the amplification circuit and the resonance circuitry are configured to drive one or more loads based on different selectable resonance frequencies. The resonance circuitry may include a first resonant network operable to resonate at a first frequency associated with one of the plurality of different selectable resonance frequencies and a second resonant network operable to resonate at a second frequency associated with another one of the plurality of different selectable resonance frequencies.

Yet further specific example embodiments and aspects, which may build on one or more of the above examples, involve a frequency-generating signal circuit to provide at least one signal to the switching amplifier circuit at one or more of the plurality of different switching frequencies, and an application specific type of load such as a wireless-signal generator or one or more DBD (dielectric barrier discharge) loads driven by the switching amplifier circuit. An example of a wireless-signal generator may include the load being an inductive circuit (e.g., a coil or an inductor driven by two terminals with a capacitor in parallel for an LC circuit), and modulation/combiner circuitry to encode a signal driving the inductive load for proper recognition of the wireless signal by a wireless-signal receiver (e.g., including a coil or an inductor, a demodulator and an RC circuit (in series) for presenting the demodulated/decode signal to a detection circuit such as a microcomputer circuit). In various example embodiments, circuit-based systems and devices according to the present disclosure may including the wireless-signal generator, the wireless-signal receiver, or both the wireless-signal generator and wireless-signal receiver. As an example in connection with use of one or more DBD-type loads, the switching amplifier circuit may be configured with the load(s) wherein by using at least two distinct frequencies from among a plurality of different switching frequencies, in a frequency-controllable or frequency-alternating manner, the load or loads cause the generation of plasma. In further example embodiments, circuit-based systems and devices according to the present disclosure may including the load(s), equipment connected to the load(s), or both the load(s) and the equipment connected thereto.

In yet other specific example embodiments, exemplary aspects of the present disclosure provide an alternative circuit design and methodology to the Haber Bosch process, with the plasma-assisted nitrogen fixation using the dielectric barrier discharge being able to achieve much cleaner and decentralized fertilizer production. In one specific example, by using a frequency-selective Class E power amplifier that is able to drive DBD plasma loads sequentially at MHz frequencies by using the reactance compensation and frequency-selective resonant networks, power amplifiers according to the present disclosure are able to output over 500 W (e.g., 600 W) at relatively high frequencies above one, a few or several MHz. In certain specific examples, such power is delivered at 12.4 MHz and 15.5 MHz with a peak efficiency of greater than 85% (e.g., as high as 91.5% in one example).

The above discussion is not intended to describe each example aspect or embodiment. The figures and description that follow also exemplify various embodiments.

BRIEF DESCRIPTION OF FIGURES

Various example embodiments, including experimental examples, may be more completely understood in consideration of the following detailed description in connection with the accompanying drawings, each in accordance with the present disclosure, in which.

Figures 1, 2:
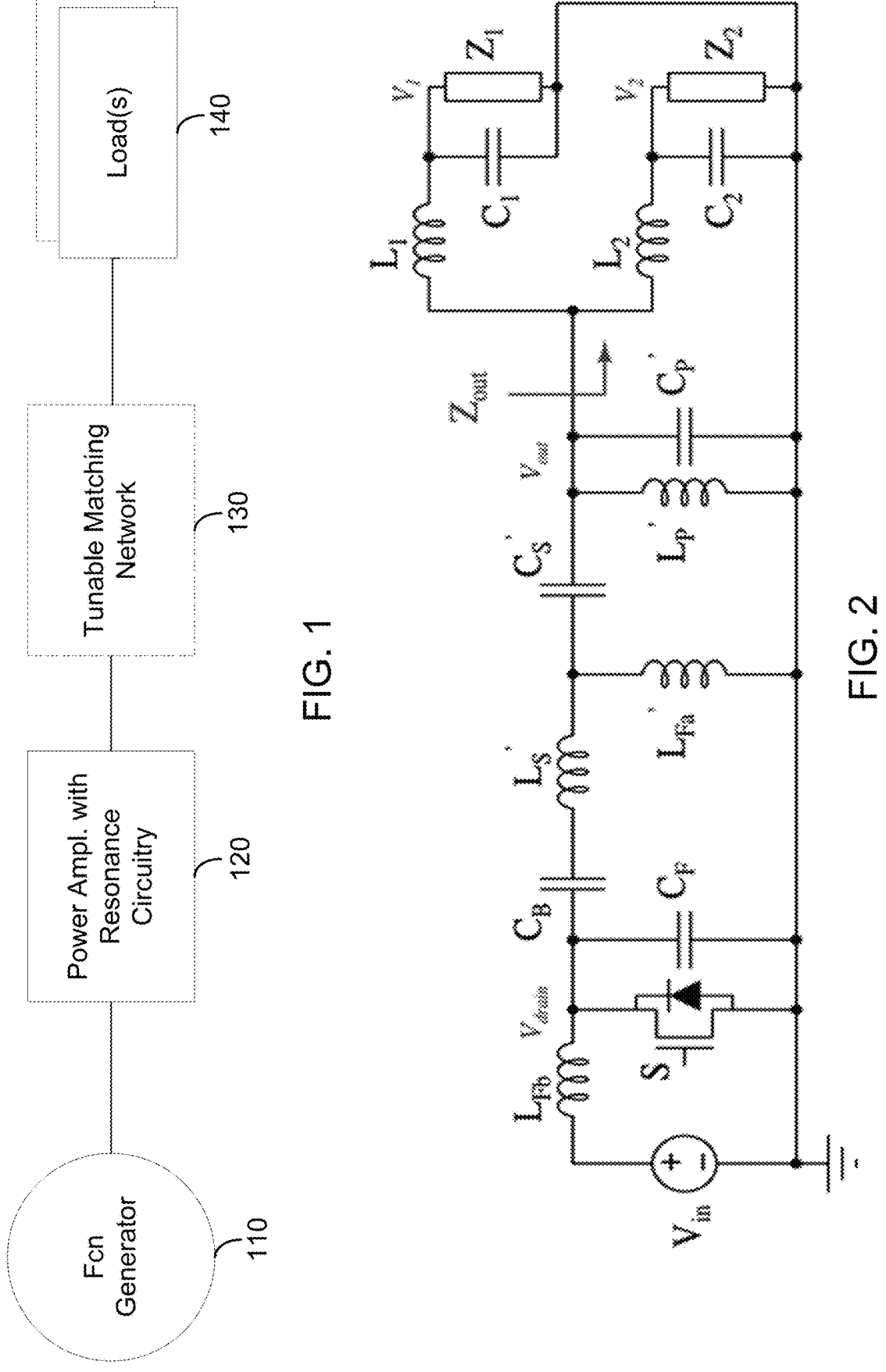
FIG. 1 is a circuit diagram including a switch-mode power amplification circuit, according to one example of the present disclosure.
FIG. 2 is a circuit diagram including a switch-mode power amplification circuit, according to another example of the present disclosure.

While various embodiments discussed herein are amenable to modifications and alternative forms, aspects thereof have been shown by way of example in the drawings and will be described in detail. It should be understood, however, that the intention is not to limit the disclosure to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

DETAILED DESCRIPTION

Aspects of the present disclosure are believed to be applicable to a variety of different types of apparatuses, systems and methods involving devices characterized at least in part by switching-power-amplification circuits (aka switch-mode amplifiers) as may be used for certain types of loads such as reactive loads such as signal-generation circuits for generating wireless signals and plasma loads which are typically highly-reactive before chemical-reaction breakdown. While the present disclosure is not necessarily limited to such aspects, an understanding of specific examples in the following description may be understood from discussion in such specific contexts.

In certain examples, methods and semiconductor structures are directed to a switching (power) amplification circuit, including resonance circuitry to resonate at a frequency associated with at least one of a plurality of different selectable resonance frequencies. The switching amplification circuit is configured to deliver power to one or multiple loads while the switching amplifier circuit is operating based on one or more of the selectable resonance frequencies. For example, the resonance circuitry may be settable to resonate at a selected one of the plurality of different selectable resonance frequencies for delivering power to one or more of the loads via a design feature of the resonance circuitry linked to the selected one of the plurality of different selectable resonance frequencies.

Accordingly, in the following description various specific details are set forth to describe specific examples presented herein. It should be apparent to one skilled in the art, however, that one or more other examples and/or variations of these examples may be practiced without all the specific details given below. In other instances, well known features have not been described in detail so as not to obscure the description of the examples herein. For ease of illustration, the same connotation and/or reference numerals may be used in different diagrams to refer to the same elements or additional instances of the same element. Also, although aspects and features may in some cases be described in individual figures, it will be appreciated that features from one figure or embodiment can be combined with features of another figure or embodiment even though the combination is not explicitly shown or explicitly described as a combination.

Exemplary more specific aspects of the present disclosure are directed to use of switch-mode power amplifiers to maintain high efficiencies at a fixed frequency and/or constant load condition and in other specific alternative example implementations, to use of switch-mode power amplifiers to which extend the frequency and load range by reactance compensation, impedance compression, phase-switched impedance modulation, and load-independent power amplifier design. Yet further aspects of the present disclosure are directed to a switch-mode power amplifier that facilitates measuring the load impedance. For example, as applied in connection with a plasma load which is almost entirely reactive before the breakdown, because its impedance varies with the operating conditions, according to the present disclosure a tuning process, for tuning to the matching network, is used as the applied voltage is increased to commence the plasma generation process.

In certain more specific examples, the switching amplification circuit includes or refers to one or more switch-mode power amplifiers (e.g., Class D, Class E, and Class Φ2 power amplifiers) and the incorporation of reactance compensation circuitry and load-independent techniques to design a switch-mode power amplifier that is able to drive certain types of loads (e.g., DBD plasma loads) at any one or more of different frequencies. In certain experimental embodiments, for example in contrast to use of linear power amplifiers in high-frequency applications which have the advantages of linearity and simplicity but low efficiencies, the amplifier is configured to directly drive DBD plasma loads drive DBD plasma loads at different frequencies that are on the order of one megahertz (MHz). Such switch-mode power amplifiers achieve much higher efficiencies under zero-voltage-switching (ZVS) operations such that as the frequency increases, the overall size of the power amplifier becomes smaller, especially for the magnetic components.

Consistent with the above aspects, such a manufactured device or method of such manufacture may involve aspects presented and claimed in U.S. Provisional Application Ser. No. 63/142,969 filed on Jan. 28, 2021 (S20-531) with Appendices, to which priority is claimed. To the extent permitted, such subject matter is incorporated by reference in its entirety generally and to the extent that further aspects and examples (such as experimental and/more-detailed embodiments, and cited references which shed light on certain of the equations disclosed herein) may be useful to supplement and/or clarify.

Consistent with the present disclosure, such switch-mode power amplifier and/or methods may be used in connection with resonance circuitry which includes a first resonant network operable to resonate at a first frequency associated with one of the plurality of different selectable resonance frequencies and a second resonant network operable to resonate at a second frequency associated with another one of the plurality of different selectable resonance frequencies. As a further example, such resonance circuitry as part of or integrated with the switch-mode power amplifier are cooperatively configured to drive one or more dielectric barrier discharge (DBD) loads.

In other specific examples, the above-types of power amplification circuitry may include at least one such DBD load and also include a frequency-generating signal circuit to provide at least one signal to the switching amplifier circuit for causing the switching amplifier circuit to switch at one or more of the plurality of different switching frequencies. Further, the switching amplifier circuit may be configured to drive (e.g., directly) one or more such loads using at least two distinct frequencies in a frequency-controllable or frequency-alternating manner, to cause the generation of plasma. In other more-specific examples, the power amplification circuitry may include a wireless-signal generator as the driven load, wherein the wireless-signal generator includes an inductive circuit which typically reacts to the change in frequency.

In various specific experimentally-related examples, aspects and embodiments of the present disclosure are directed to such above-characterized systems, devices and methods which include and/or involve the different switching frequencies being in a frequency range that includes one or more frequencies which: are greater than or equal to 100 kHz; do not exceed a frequency beyond an order of megahertz (MHz), or are greater than or equal to 1 megahertz (MHz) and which do not exceed a frequency of 20 MHz.

In examples involving the power amplification circuitry being configured or used to drive multiple loads including a first load and a second load, the resonance circuitry may include reactance-compensation circuitry to mitigate delivery of power, from the switching amplifier circuit, to the first load being different than to the second load. Also, the switching amplifier circuit may be configured: to mitigate delivery of respective amounts of power, from the switching amplifier circuit, to the first load being different than to the second load, and/or to deliver power to the first load by presenting a first voltage level to the first load and by presenting a second voltage level to the second load, wherein the first voltage level is sufficiently greater than the second voltage level so that only one of the first load and the second load is in active use at any given time.

In certain examples, it is useful to characterize an aspect of the switching amplifier circuit by an output impedance $Z_{out}$ that is constant at a first one and at a second one of the plurality of different selectable resonance frequencies, and wherein the resonance circuitry includes components to realize the output impedance $Z_{out}$. With an output resistance being included as part of or coupled to the switching amplifier circuit and the switching amplifier circuit being characterized by a $Z_{out}$ that is constant at a first one and at a second one of the plurality of different selectable resonance frequencies, the output resistance may be matched to the $Z_{out}$.

In yet other related examples, the switching amplifier circuit may be configured or used to operate according to at least two of the following attributes: the switching amplifier circuit being configured to mitigate delivery of respective amounts of power, from the switching amplifier circuit, to the first load being different than to the second load; the switching amplifier circuit being configured to mitigate causing the first load and the second load to be active use at any given time by presenting respective voltage levels the first load and the second load; and the resonance circuitry being configured with components to realize a switching-amplifier-circuit output impedance $Z_{out}$ that is constant at a first one and at a second one of the plurality of different selectable resonance frequencies.

In certain examples building on the above examples and aspects, such a switching amplifier circuit is used with one or more load in a cooperative manner so as to generate plasma via a plasma-assisted nitrogen reaction occurring at less than 400° C. and under pressure of less than 15 megapascals and/or to generate a plasma via a plasma-assisted nitrogen reaction, while the switching amplifier circuit realizes a peak efficiency of greater than 85% and output 600 Watts at one or more frequencies in a range 9 MHz to 20 MHz.

Turning now to the drawing, FIG. 1 is a circuit diagram including a switch-mode power amplification circuit, according to one of many examples which include aspects and/or attributes consistent with the present disclosure. The circuit of FIG. 1 illustrates a signal-function generator 110, a switching amplifier circuit 120 that includes resonance circuitry (not shown in FIG. 1), an optional (tunable) matching network 130 and at least one load 140. The switching amplifier circuit 120 and its resonance circuitry are designed to resonate at a frequency associated with at least one of a plurality of different selectable resonance frequencies and to deliver power to at least one (e.g., frequency-reactive) load 140 while the switching amplifier circuit is operating based on the at least one of a plurality of different switching frequencies. In certain specific examples, the switching amplifier circuit 120 may be a Class E power amplifier, and each of the plurality of different switching frequencies may vary, for example, on the order of a MegaHertz or within a range of 500 KHz to 20 MHz.

When used in connection with the matching network 130, the resonance circuitry includes a first resonant network operable to resonate at a first frequency associated with one of the plurality of different selectable resonance frequencies and a second resonant network operable to resonate at a second frequency associated with another one of the plurality of different selectable resonance frequencies. As used in the specific context involving use of a DBD load, the signal-function generator 110 provides at least one signal to the switching amplifier circuit at one or more of the plurality of different switching frequencies.

FIG. 2 is a schematic of a specific example circuit, consistent with the diagram of FIG. 1 and according to another example of the present disclosure, including a switch-mode power amplification circuit having a frequency-selective Class E power amplifier. Table I, as provided below, lists the design parameters of the specific example circuit of FIG. 2.

TABLE I

| Parameter | Value |
|---|---|
| $V_{in}$ | 200 V |
| P | 600 W |
| $f_1$ | 12.4 MHz |
| $f_2$ | 15.5 MHz |
| S | G3R350MT12J |

TABLE I-continued

| Parameter | Value |
|---|---|
| $L_{Fb}$ | 1.12 μH |
| $C_B$ | 4 nF |
| $C_F$ | 68 pF |
| $L_{S'}$ | 1.35 μH |
| $L_{Fa'}$ | 1.54 μH |
| $C_{S'}$ | 200 pF |
| $L_{P'}$ | 225 μH |
| $C_{P'}$ | 690 pF |
| $L_1$ | 1.83 μH |
| $C_1$ | 79 pF |
| $L_2$ | 1.36 μH |
| $C_{load}$ | 20 pF |
| $R_{load}$ | 758 Ω |

An understanding of how the circuit of FIG. 2 may be configured to operate in accordance with specific aspects of the present disclosure may be appreciated by a discussion which breaks down some of the circuitry used in the circuit of FIG. 2 and their respective functions. This discussion, which is provided below and in connection with the remaining figures, includes discussion of an experimental DBD electrode design using a plasma-type load, and with plasma impedance measurements, design particulars of a frequency-selective power amplifier such as shown in FIG. 2, and experimental results based on laboratory testing of such circuitry.

A DBD reactor has two electrodes located on the opposite sides of a dielectric board. The electrode on the front side of the board is exposed to air, and the electrode on the back side is covered by a layer of dielectric material to avoid breakdown. Generating DBD plasma at MHz frequencies often requires a careful selection of the dielectric material for the board to produce certain capacitance with low loss. Previous research has used mica at 13.56 MHz, and here Rogers 4003C is chosen because of its low dissipation factor at high frequencies and the possibility to be integrated to a PCB. FIG. 1(a) shows the electrode on the front side of the Rogers board made by a thin line of copper tape, and FIG. 1(b) shows the grounded electrode on the back made by a copper plane covered by a layer of Kapton tape. The present disclosure is based on experimentation with several different widths of the front electrode and thicknesses of the Rogers board. The designs with low capacitance (narrow copper lines on the front side) and small board thickness are easier to breakdown at lower voltages. The electrodes used in this work has a board thickness of 0.2 mm and a front electrode width of 1 mm and length of 100 mm.

Plasma load impedances are sensitive to the operating conditions, such as temperature, pressure, and power delivered. Before the breakdown, the load is nearly purely reactive; after the breakdown, the load impedance changes with the increased applied voltage, especially for the resistive part. A commercial linear power amplifier may be used to drive the plasma load for impedance measurement. When the power amplifier drives a highly reactive load, most of the power gets reflected, making it hard to reach the voltage for plasma breakdown. Therefore, the plasma load is matched to 50Ω using a tunable matching network and actively adjust the network as the plasma impedance changes. Calibration of the probes is also essential for accurate measurements, especially the phase angle between the voltage and current measurements. Even after the breakdown, the plasma load can still have a relatively high quality factor (Q), and a small skew can result in a large error in the measured impedance. Knowing the caveats above, the load is measured in a DBD plasma system using the following steps listed as steps 1, 2, 3 and 4. Step 1 involves voltage and current probe calibration. Voltage measurements require the use of a capacitor divider since the output voltage at the plasma load is high. Before connecting to the DBD load, the voltage and current are measured across a 50Ω radio-frequency (RF) load driven by a linear power amplifier (ENI A1000) at the desired frequency and power level. During the measurement, it is important to adjust the skew time between the two probes to make the phase angle approximately 0°. The measured parameter "$V_r/I_r$" is a reference for 50Ω.

The second step involves small signal impedance matching of the DBD load to 50Ω. After calibrating the probes, they are connected the DBD load and measure the small signal impedance with a tunable matching network connected. Adjustment of the network is effected until the measured impedance is roughly 50Ω. Taking the measurements with the probes connected allows for better matching, since the capacitance of the DBD load can be small (on the order of a few pF to hundreds of pF depending on the electrode design). The small signal measurement sets the initial matching conditions before powering on the system, which accelerates the impedance matching in the next step.

Step 3 involves measurement of the DBD plasma load. The DBD load and the matching network are then connected to the linear power amplifier and a power meter (Keysight N1914A). The overall setup is shown in FIG. 2. As the applied voltage increases, the matching network is adjusted when the reflected power shown on the power meter becomes significant. Finally at the desired output power after the plasma breakdown, the voltage and current measurements are recorded along with the phase angle between them ($V_m$, $I_m$).

Step 4 involves calculating the plasma load impedance. Using the parameter $V_r/I_r$ as the reference for 50Ω in step 1, and the voltage and current measurements in step 3), the plasma impedance ("$Z_{load,plasma}$") may be calculated as follows:

$$[(V_m/I_m)/(V_r/I_r)]\times 50 \qquad \text{Equation 1}$$

Figure 3:
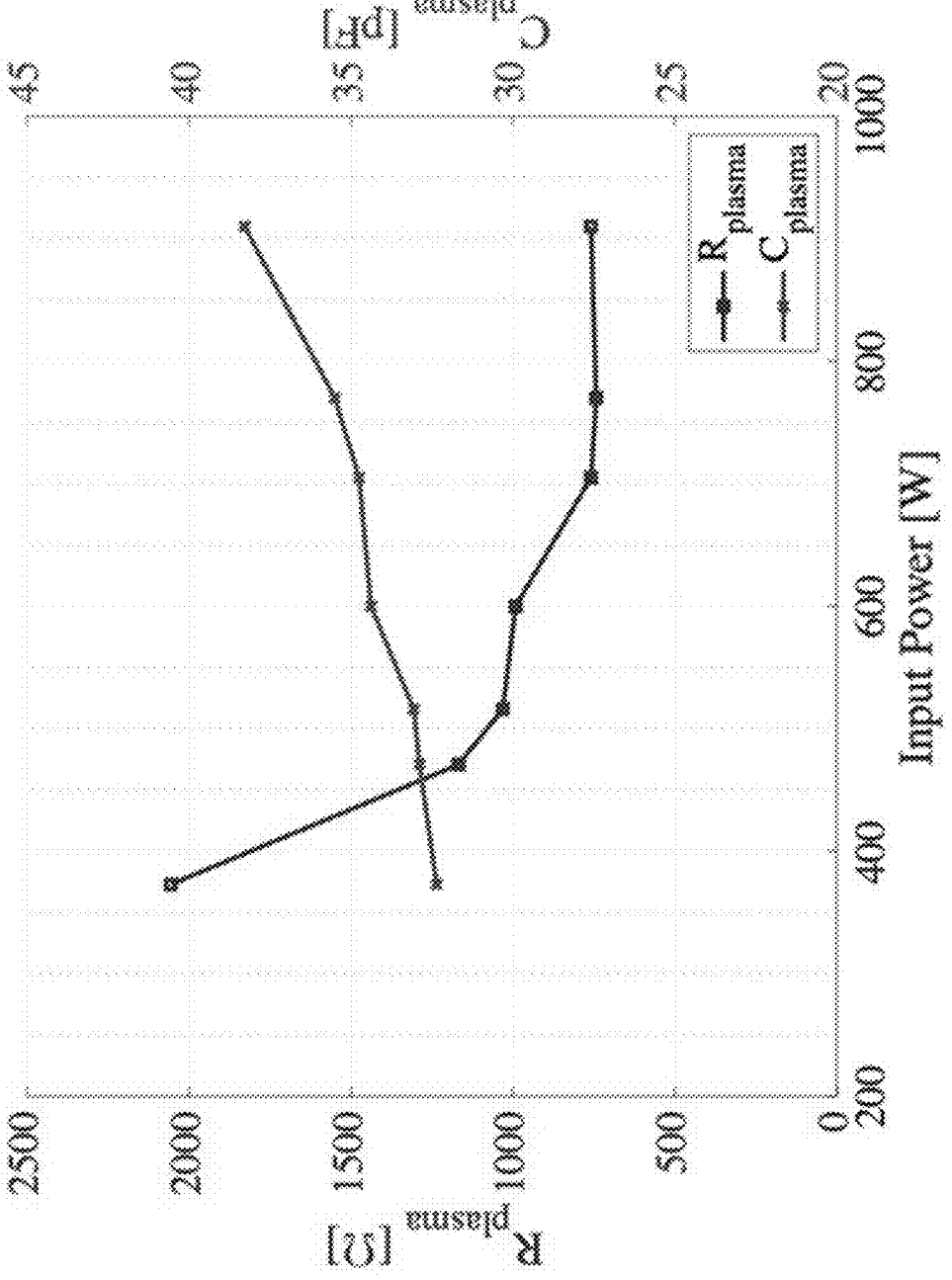
FIG. 3 is a graph illustrating certain aspects of an exemplary circuit shown in FIG. 4, also according to aspects of the present disclosure.
Figure 4:
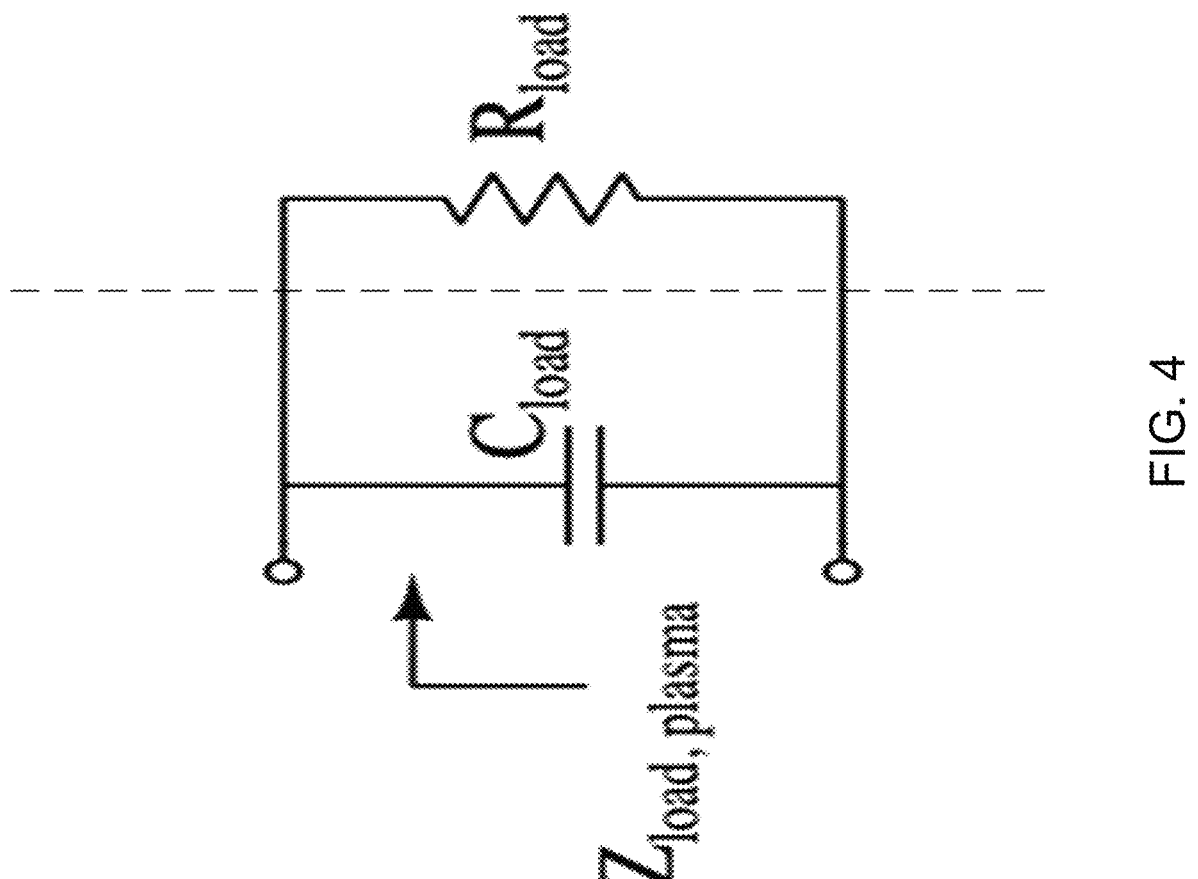
FIG. 4 is an equivalent circuit diagram illustrating aspects of exemplary switch-mode power amplification circuitry consistent with aspects of the present disclosure.

FIG. 3 is a graph, also according to aspects of the present disclosure, showing the measured plasma impedance at 13.56 MHz in terms of the parallel resistance and capacitance as modeled in FIG. 4. More particularly, FIG. 4 shows the C and R components in parallel form a partial circuit corresponding to the impedance load with plasma and if the R component on the right side of the dashed line is removed (or snipped out), the equivalent impedance load without plasma would be illustrated. The plasma breakdown happens at an input power of around 200 W and an output voltage of 700 $V_{rms}$. As the power increases after the breakdown, the output voltage stays relatively unchanged, but the length of the plasma strip generated at the front electrode gradually extends, causing a decrease in the resistance. The plasma strip reaches the full length of the front electrode at about 600 W. The measured load impedance has a parallel capacitance of 33 pF (including 13 pF of the connectors and the board) and a resistance of 758Ω with a phase angle of approximately −70°. Because of its significant real part, the measured impedance provides a relatively reasonable estimate of the plasma load impedance. However, depending on the plasma type, electrode design, and the operating conditions, the load impedance can have a close-to-±90° phase angle. In those cases, it can be challenging to measure the plasma impedance accurately using voltage and current probes. In step 4), it is also possible to use the input power and output voltage measurements to calculate the plasma impedance. However, the input power measurement includes the power lost in the matching network, which can make the impedance measurement less accurate.

Turning now to the design of the frequency-selective power amplifier, at the measured plasma impedance, the DBD load receives around 600 W, making the electrodes too hot to run without pulsing the power at a very low burst rate. Normally, a MHz single-stage switch-mode power amplifier is able to deliver hundreds of watts continuously, therefore, a better utilization of the power amplifier is to drive multiple loads in an alternating manner or sequentially. One way of achieving this according to the present disclosure is to use switches to turn on and off certain loads (e.g., the power amplifier drives multiple loads sequentially, and within each pulsing period, the power amplifier is delivering power selectively to only one of the DBD reactors). As a result, the power amplifier is able to operate longer, while each DBD reactor only receives a fraction of the total average power). However, this approach may require more active switches and results in higher losses, and depending on the applications, these switches may require high voltage blocking and fast switching capabilities, as well as auxiliary gate drive circuitry, which could be complicated for the non-ground-referenced switches.

As an alternative approach which is consistent with another aspect of the present disclosure, a frequency selection feature is used to provide or design distinct resonant frequencies for different loads, so that power can be delivered only to the selected load by setting the switching frequency. This frequency selection approach, which can also be applied to other applications such as wireless power transfer, carries out frequency selection but without any additional switches. By using passive elements instead of active switches (FETs), the design is less expensive and less complicated. Further, the bandwidth of the amplifier may be extended as discussed below for such selective power delivery.

In connection with one such example embodiment being discussed here, a frequency-selective Class E power amplifier is designed to drive two DBD loads. The design procedure may follow steps 1 through 4 as explained below.

Figure 5:
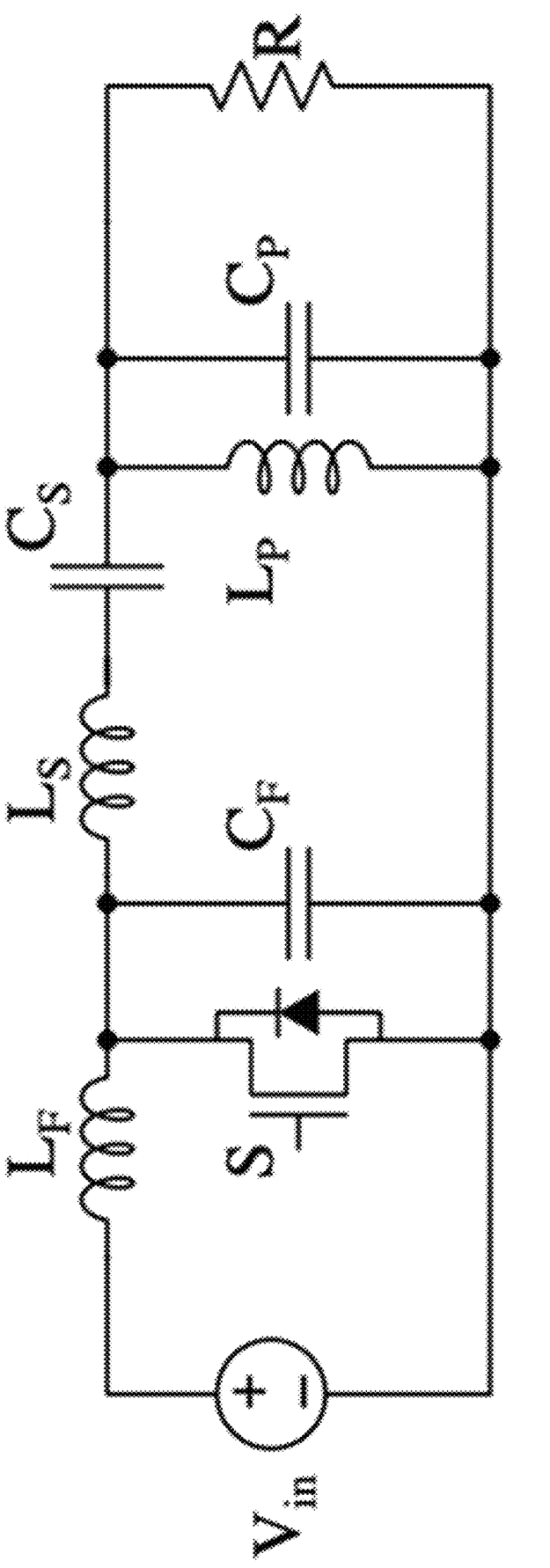
FIG. 5 is a circuit diagram illustrating an exemplary load-independent switch-mode power amplification circuitry, according to an example of the present disclosure.

Step 1 involves design of a Class E power amplifier, as shown in FIG. 5, with finite DC-feed inductance that is able to maintain efficient ZVS operations when driving a variable load. $L_F$ and $C_F$ may be considered as the main design components to meet ZVS, while the output network of $L_S$-$C_S$-$L_P$-$C_P$ filters out higher harmonics. The parameters $L_F$ and $C_F$ can be calculated via the expressions in Equation 2 as follows:

$$1/[\sqrt{(L_F C_F)}]=2\pi f_{IN}, \text{ and}$$

$$\sqrt{(L_F/C_F)}=k_f R_{min},$$

where $f_{IN}$ is 1.3 to 1.5 times the switching frequency (13.56 MHz in this example), and $k_f$ is between 0.2 and 1.5. For example, an $f_{IN}$ of 1.4 and $k_f$ of 1 may be selected with an input voltage of 200 V and power of 600 W. Setting the input voltage to 200 V allows the use of the 1.2 kV high-frequency power devices and easier impedance matching.

Step 2 involves extending the bandwidth of the power amplifier. The conventional switch-mode power amplifiers only operate at a single frequency. When shifting away from the designed frequency, both the efficiency and output power degrade significantly. Extending the bandwidth for the frequency-selective power amplifier is necessary to ensure efficient operations at different frequencies and same power delivery to all of the loads. Reactance compensation is used here because it only requires two sets of LC resonant tanks (LSCS and LP-CP), which are already in the design. The first step is to design LS and CS based on the output filtering requirement (if any) and the target bandwidth. Next, LP and CP are calculated based on a reactance compensation requirement following known equations (as in the above-references U.S. Provisional) as below via the expressions in Equation 3:

$$C_F + (1/\omega^2 L_F) = 2/\omega R \times (Q_S - Q_P),$$

$$1/\sqrt{(L_P \cdot C_P)} = \omega,$$

$$1/\sqrt{(L_S \cdot C_S)} = \omega, \qquad \text{Equation 3}$$

where $Q_P = \omega R C_P$, $Q_S = \omega L_S R$, $\omega$ is the center frequency, and R is the output resistance of the Class E power amplifier determined in the previous step. Substituting the CF and LF calculated from the previous step, QS=2.5, and $\omega = (2\pi)$ 13.56 MHz into the equation results in a QP of 1.48.

Figure 6:
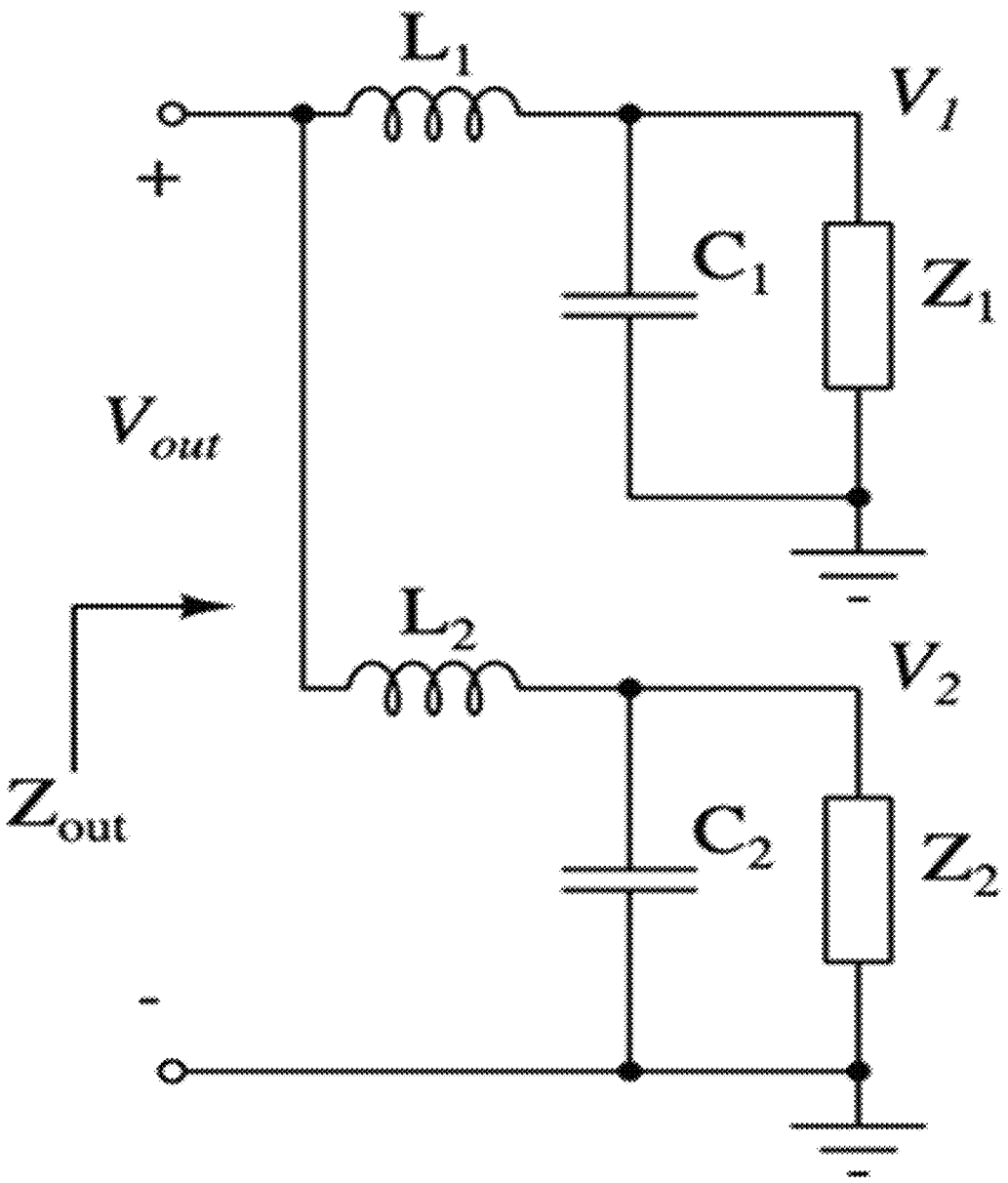
FIG. 6 is a circuit diagram illustrating aspects of exemplary switch-mode power amplification circuits consistent with aspects of the present disclosure.

Step 3 involves designing the output resonant networks for the two loads. Selective power delivery to one of the two loads uses two output resonant networks, resonating at different frequencies. FIG. 6 shows the schematic of the output networks. In certain examples different design guidelines are used. A first design guideline is to deliver the same amount of power to the active plasma load at the corresponding frequency. More specifically, Z1 and Z2 of FIG. 6 are the DBD loads as modeled in FIG. 4, where only one of them has plasma generated at a time. As a second guideline, the voltage across the active plasma load is to be made significantly larger than the other one (e.g., V1>>V2 at f1, V2>>V1 at f2) so that only one load is receiving power and generating plasma at a time. This may permit, for example, designing for a minimum voltage ratio of 2 (V1 V2>2 at f1, and V2 V1>2 at f2), where:

$$|1-(f1/f2)^2|Q_1 > 2,$$

$$|1-(f2/f1)^2|Q2 > 2$$

A high Q allows the two designed frequencies to be close together, however, it also makes the network hard to tune and sensitive to component variations, including the variation in the plasma capacitance. A low Q requires the two frequencies to be farther apart, but at the same time, both of f1 and f2 need to be within the bandwidth of the designed power amplifier. For a plasma load of Cload=20 pF and Rload=758Ω, as an example, a Q of 5 is selected for both output networks with f1=12 MHz and f2=15.5 MHz.

Further, in certain examples it may be helpful to confirm that the output impedance (Zout) at f1 and f2 are equal. If Zout at the two frequencies are not equal due to the interaction of the two close resonances, the component values can be tuned out as well as the designed frequencies to achieve equal Zout.

Figures 7A, 7B:
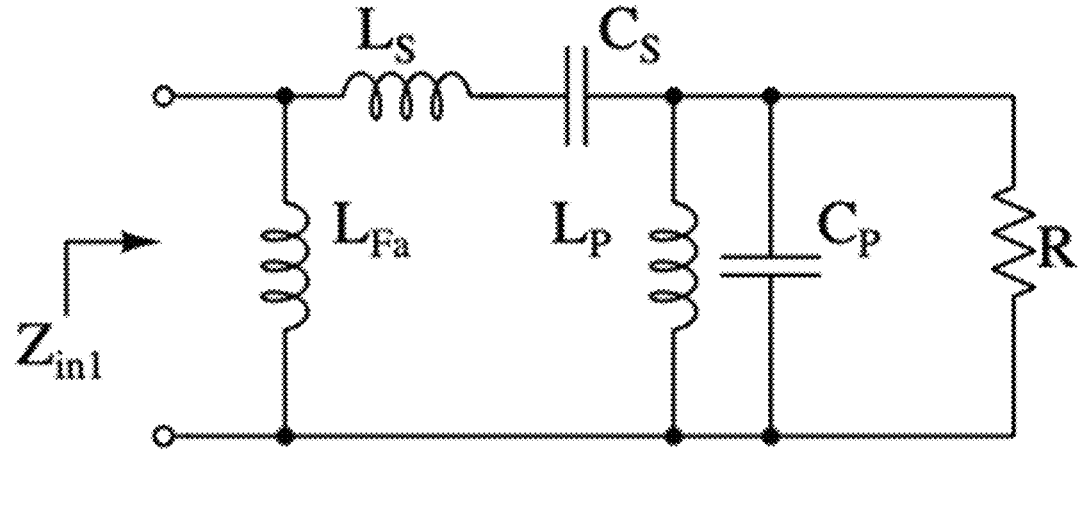
FIGS. 7A and 7B are circuit diagrams illustrating aspects of exemplary switch-mode power amplification circuits consistent with aspects of the present disclosure.

Step 4 involves matching the output resistance to the plasma load. This last step is to match the output resistance of the designed Class E power amplifier to the total impedance of the load (Zout). FIGS. 7A and 7B show the impedance transformation of the power amplifier's output resistance by a factor of 1/m2, where LF=LFa/LFb. The reactive part of Zout can be combined to LP or CP, so that Re(Zout) =R/m2.

One of many advantages of a technique with such aspects is that the impedance waveform across frequency is exactly the same after the transformation. Therefore, in such examples, the transformation step does not change the bandwidth of the designed power amplifier. Again, the overall schematic of the experimental example design is shown in FIG. 2 with the design parameters shown in Table I.

Figure 8:
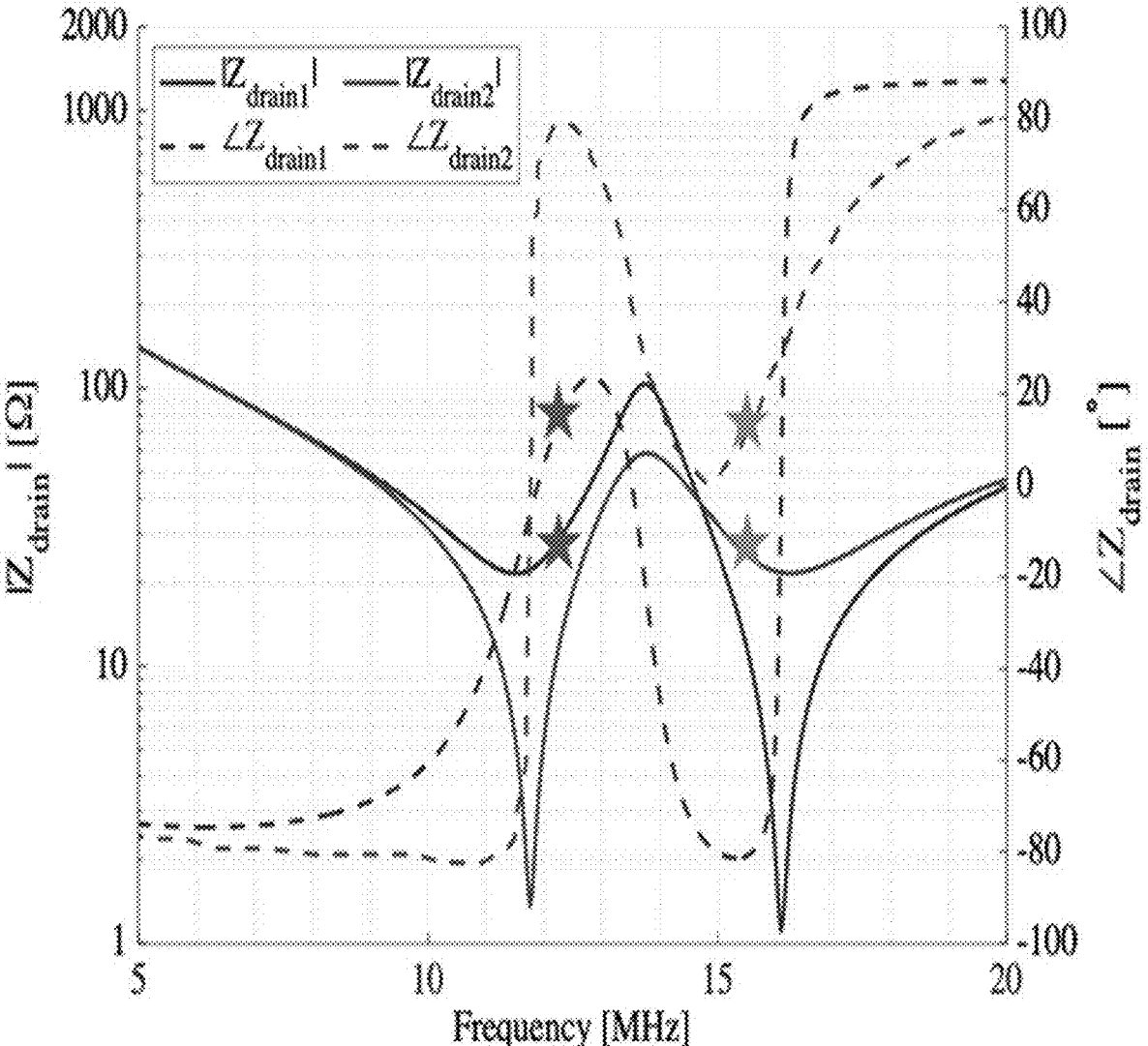
FIG. 8 is a graph illustrating certain attributes of an exemplary switch-mode power amplification circuitry according to aspects of the present disclosure.

FIG. 8 (which corresponds to FIG. 12 of Appendix C of the above-reference U.S. Provisional) is a graph illustrating certain attributes of an exemplary switch-mode power amplification circuitry according to aspects of the present disclosure. The graph shows measured small signal output impedances (Zout): Zout at f1=12.4 MHz (labeled with darker or red stars) roughly equals to Zout at f2=15.5 MHz (labeled with lighter or gray stars).

Next, the design may be tested with the dummy loads and with the system efficiency calculated using the voltage measurements V1 and V2 and the dummy load resistance. Measured waveforms of Vdrain, V1, and V2 may be obtained at 12.4 MHz and 15.5 MHz. Capacitor dividers may be used with 1 pF C0G capacitors connecting between the probes and the nodes-to-be-measured for these high voltage measurements. The actual Vdrain, V1, and V2 are 9.68×, 10.14×, and 9.82× the measured values, respectively. V1 at f1=12.4 MHz and V2 at f2=15.5 MHz are significantly larger than the voltage across the no-plasma load in each case, ensuring the power delivery and plasma generation only at the selected load. The ratios of V1 V2 at f1 and V2 V1 at f2 are not the same, because otherwise 2πf1L2=2πf2L1, which contradicts above-discussed aspects for f1 not being equal to f2. Assuring the same power delivery to each load is more important so long as the voltage across the no-plasma load is much lower than the breakdown voltage.

Figure 9:
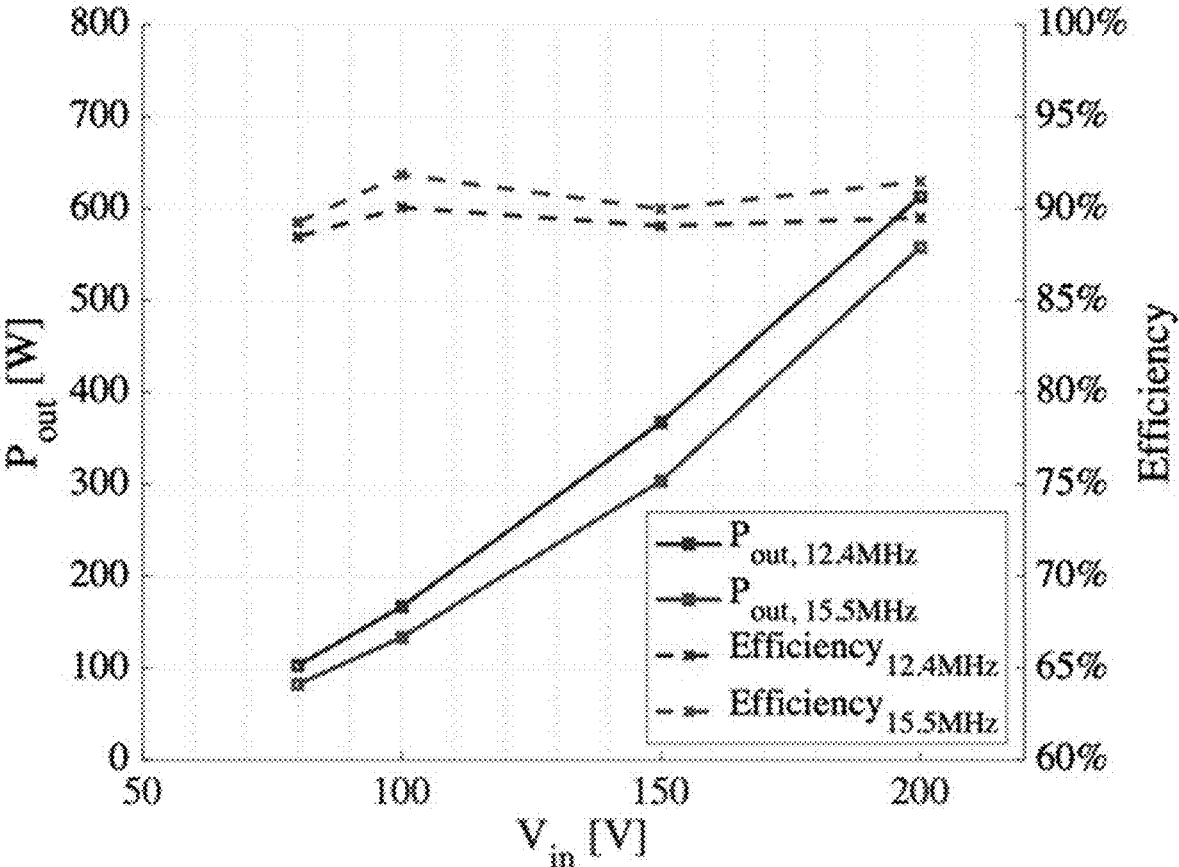
FIG. 9 is a graph illustrating certain additional attributes of an exemplary switch-mode power amplification circuitry according to aspects of the present disclosure.

FIG. 9 shows the power and efficiency plots at both of the designed frequencies. Due to the thermal limitation of the DBD load and power ratings of the dummy loads, a 1% burst rate may be used during the testing. The design achieves a peak efficiency of 91.5% at 15.5 MHz. Finally, the design is tested with the DBD loads. At 12.4 MHz, plasma is generated on one of the two load electrodes, and at 15.5 MHz, plasma is generated on the other.

Figure 10:
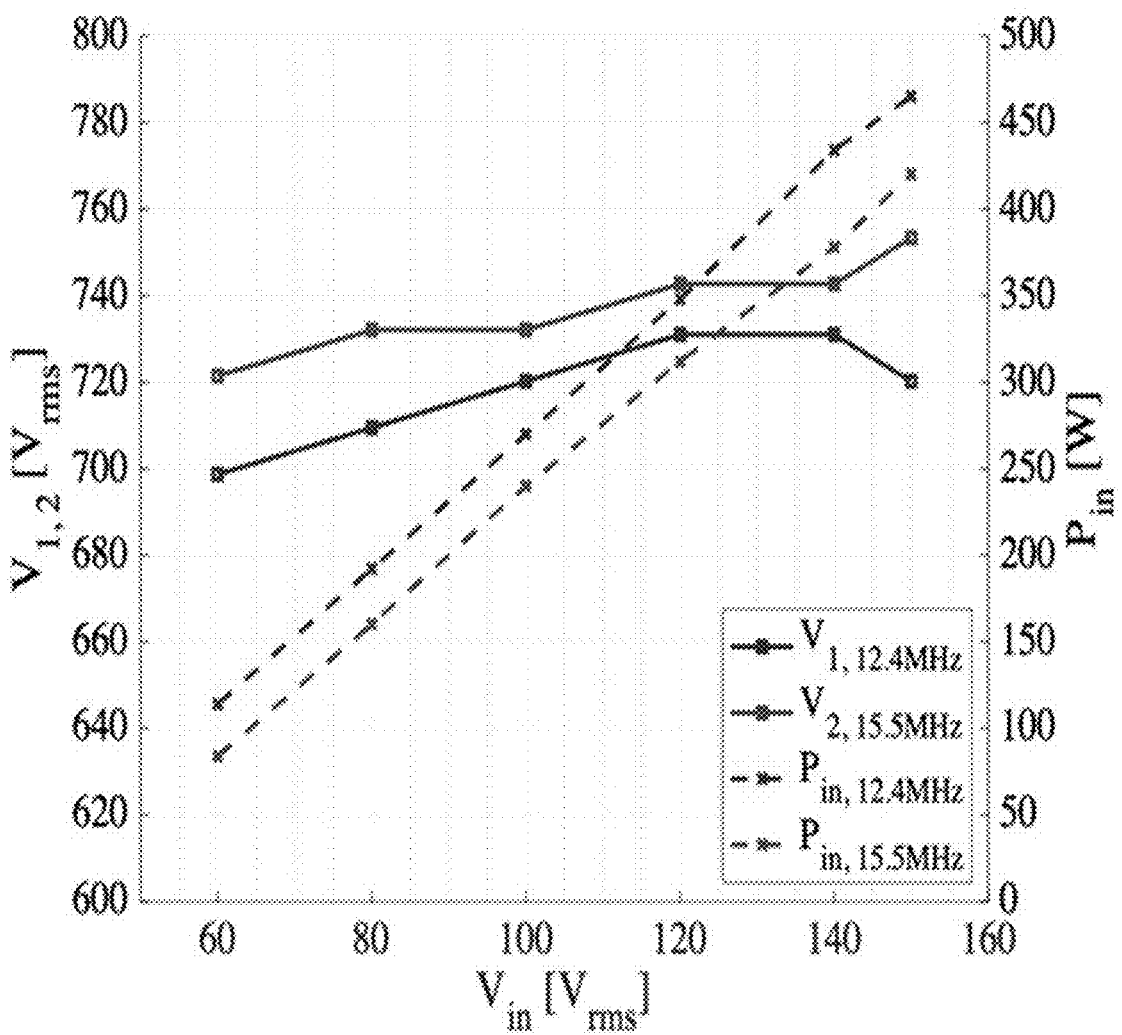
FIG. 10 is a graph illustrating certain other attributes of an exemplary switch-mode power amplification circuitry according to aspects of the present disclosure.

FIG. 10 is a graph illustrating certain other attributes of an exemplary switch-mode power amplification circuitry according to aspects of the present disclosure. More particularly, FIG. 10 shows the measured output voltages and input power when the designed power amplifier drives the DBD loads. At both frequencies, the plasma starts at an input voltage of around 60 Vrms and an input power of around 100 W. After the breakdown, the measured voltage across the load remains at about 720 Vrms regardless of the input power. Since the plasma load is variable and hard to measure precisely, the output power and efficiency are not measured when directly driving the DBD loads.

In connection with the above and other examples, specific examples and aspects of the present disclosure are directed to power amplifier circuitry which may have two or more LC resonant networks at the output, resonating at two different frequencies f1 and f2. By selecting the switching frequency, power to one of the two loads can be delivered. The designed power amplifier is able to directly drive the dielectric barrier discharge (DBD) plasma at two distinct frequencies in an alternating manner. According to the present disclosure it is possible to increase the number of loads that the power amplifier drives and increase the number of operating frequencies. The load can be purely resistive, or include a reactive component. Exemplary commercial applications of such example aspects and embodiments include plasma assisted nitrogen fixation in fertilizer production, and applications involving dielectric barrier discharge or other types of high-frequency plasma generation, wireless power transfer, and bio-medical applications.

Accordingly, many different types of processes and devices may be advantaged by such aspects, the above aspects and examples as well as others (including the related examples in the above-identified U.S. Provisional Application (S20-531).

It is recognized and appreciated that as specific examples, the above-characterized figures and discussion are provided to help illustrate certain aspects (and advantages in some instances) which may be used in the manufacture of such structures and devices. These structures and devices include the exemplary structures and devices described in connection with each of the figures as well as other devices, as each such described embodiment has one or more related aspects which may be modified and/or combined with the other such devices and examples as described hereinabove may also be found in the Appendices of the above-referenced Provisional.

The skilled artisan would also recognize various terminology as used in the present disclosure by way of their plain meaning. As examples, the Specification may describe and/or illustrates aspects useful for implementing the examples by way of various semiconductor materials/circuits which may be illustrated as or using terms such as layers, blocks, modules, device, system, unit, controller, and/or other circuit-type depictions. Such semiconductor and/or semiconductive materials (including portions of semiconductor structure) and circuit elements and/or related circuitry may be used together with other elements to exemplify how certain examples may be carried out in the form or structures, steps, functions, operations, activities, etc. It would also be appreciated that terms to exemplify orientation, such as upper/lower, left/right, top/bottom and above/below, may be used herein to refer to relative positions of elements as shown in the figures. It should be understood that the terminology is used for notational convenience only and that in actual use the disclosed structures may be oriented different from the orientation shown in the figures. Thus, the terms should not be construed in a limiting manner.

Based upon the above discussion and illustrations, those skilled in the art will readily recognize that various modifications and changes may be made to the various embodiments without strictly following the exemplary embodiments and applications illustrated and described herein. For example, methods as exemplified in the Figures may involve steps carried out in various orders, with one or more aspects of the embodiments herein retained, or may involve fewer or more steps. Such modifications do not depart from the true spirit and scope of various aspects of the disclosure, including aspects set forth in the claims.

What is claimed:

1. An apparatus comprising:
   a switching amplifier circuit, that is frequency selective and includes resonance circuitry to resonate at a frequency associated with a plurality of different selectable resonance frequencies, to deliver power to at least one load, including a frequency-reactive load, while the switching amplifier circuit is operating based on a plurality of different switching frequencies;
   a first resonant network, as part of the resonance circuitry, to resonate at a first frequency associated with one of the plurality of different selectable resonance frequencies and with the at least one load; and
   a second resonant network, as part of the resonance circuitry, to resonate at a second frequency associated with another one of the plurality of different selectable resonance frequencies and with said at least one load, wherein the switching amplifier circuit is to drive the at least one load using at least two distinct frequencies, from among the plurality of different switching frequencies, in a frequency-controllable or frequency-alternating manner, to cause generation of plasma at said at least one load in response to the first resonant network resonating at the first frequency and the second resonant network resonating at the second frequency.

2. The apparatus of claim 1, wherein the switching amplifier circuit is a Class E power amplifier, and each of the plurality of different switching frequencies is on the order of a MegaHertz.

3. A method comprising:
   driving at least one load including a frequency-reactive load, via a switching amplifier circuit that is frequency selective and ZVS (zero voltage switching) and includes resonance circuitry to resonate at a frequency associated with a plurality of different selectable resonance frequencies, and delivering power to the at least one load while the switching amplifier circuit is operating based on at least one of a plurality of different switching frequencies, wherein the resonance circuitry includes a first resonant network operable to resonate at a first frequency associated with one of the plurality of different selectable resonance frequencies and a second resonant network operable to resonate at a second frequency associated with another one of the plurality of different selectable resonance frequencies; and
   driving, via the switching amplifier circuit, the at least one load using at least two distinct frequencies, from among the plurality of different switching frequencies, in a frequency-controllable or frequency-alternating manner, to cause generation of plasma at said at least one load in response to the first resonant network resonating at the first frequency and the second resonant network resonating at the second frequency.

4. The apparatus of claim 1, further including at least one dielectric barrier discharge (DBD) load corresponding to said at least one load; and a frequency-generating signal circuit to provide at least one signal to the switching amplifier circuit at one or more of the plurality of different switching frequencies.

5. The apparatus of claim 1, wherein the at least one load includes a wireless-signal generator.

6. The method of claim 3, further including using the switching amplifier circuit and the at least one load in a cooperative manner to generate plasma-based fertilizer.

7. The apparatus of claim 1, wherein the different switching frequencies are in a frequency range that includes one or more frequencies which are greater than or equal to 100 kHz.

8. The apparatus of claim 1, wherein the different switching frequencies are in a frequency range that includes one or more frequencies which do not exceed a frequency beyond an order of megahertz (MHz).

9. The apparatus of claim 1, wherein the different switching frequencies are in a frequency range that includes one or more frequencies which are greater than or equal to 1 megahertz (MHz) and which do not exceed a frequency of 20 MHz.

10. The apparatus of claim 1, wherein the resonance circuitry is settable to resonate at a selected one of the plurality of different selectable resonance frequencies for delivering power to said at least one load which has a design feature linked to the selected one of the plurality of different selectable resonance frequencies.

11. The apparatus of claim 1, wherein the at least one load includes a first load and a second load, and the resonance circuitry includes reactance-compensation circuitry to mitigate delivery of power, from the switching amplifier circuit, to the first load being different than to the second load.

12. The apparatus of claim 1, wherein the at least one load includes a first load and a second load, and the switching amplifier circuit is to mitigate delivery of respective amounts of power, from the switching amplifier circuit, to the first load being different than to the second load.

13. The apparatus of claim 1, wherein the at least one load includes a first load and a second load, and the switching amplifier circuit is to deliver power to the first load by presenting a first voltage level to the first load and by presenting a second voltage level to the second load, wherein the first voltage level is sufficiently greater than the second voltage level so that only one of the first load and the second load is in active use at any given time.

14. An apparatus comprising:
a switching amplifier circuit, including resonance circuitry to resonate at a frequency associated with a plurality of different selectable resonance frequencies, to deliver power to at least one load while the switching amplifier circuit is operating based on at least one of a plurality of different switching frequencies; and wherein the switching amplifier circuit is characterized by an output impedance $Z_{out}$ that is constant at a first one and at a second one of the plurality of different selectable resonance frequencies, and wherein the resonance circuitry includes components to realize the output impedance $Z_{out}$.

15. The apparatus of claim 1, wherein the at least one load includes a first load and a second load and the switching amplifier circuit is to operate according to at least two of the following attributes: the switching amplifier circuit being configured to mitigate delivery of respective amounts of power, from the switching amplifier circuit, to the first load being different than to the second load; the switching amplifier circuit being configured to mitigate causing the first load and the second load to be in active use at any given time by presenting respective voltage levels to the first load and the second load; and the resonance circuitry being configured with components to realize a switching-amplifier-circuit output impedance $Z_{out}$ that is constant at a first one and at a second one of the plurality of different selectable resonance frequencies.

16. The apparatus of claim 1, further including an output resistance coupled to the switching amplifier circuit, wherein the switching amplifier circuit is characterized by an output impedance $Z_{out}$ that is constant at a first one and at a second one of the plurality of different selectable resonance frequencies, and the output resistance is matched to the output impedance $Z_{out}$.

17. The method of claim 3, further including using the switching amplifier circuit and the at least one load in a cooperative manner to generate a plasma via a plasma-assisted nitrogen reaction, while the switching amplifier circuit realizes a peak efficiency of greater than 85% and output 600 Watts at one or more frequencies in a range 9 MHz to 20 MHz.

18. The method of claim 3, wherein the at least one load includes different loads, and the method further includes compensating, via reactance-compensation circuitry, for differences in amounts of power being delivered, from the switching amplifier circuit, to the different loads.

19. The method of claim 3, further including using the switching amplifier circuit and the at least one load in a cooperative manner to generate plasma via a plasma-assisted nitrogen reaction occurring at less than 400° C. and under pressure of less than 15 megapascals.

* * * * *